United States Patent [19]

Stekelenburg

[11] Patent Number: 5,107,136
[45] Date of Patent: Apr. 21, 1992

[54] CONTROL CIRCUIT FOR AT LEAST ONE CLOCK ELECTRODE OF AN INTEGRATED CIRCUIT

[75] Inventor: Michael A. W. Stekelenburg, Eindhoven, Netherlands

[73] Assignee: U.S. Philips Corporation, New York, N.Y.

[21] Appl. No.: 501,647

[22] Filed: Mar. 29, 1990

[30] Foreign Application Priority Data

Apr. 25, 1989 [NL] Netherlands .................. 8901033

[51] Int. Cl.⁵ ............................................. H03K 5/13
[52] U.S. Cl. .................... 307/269; 307/260; 307/261
[58] Field of Search ............ 307/260, 261, 269, 480; 328/113, 223

[56] References Cited

U.S. PATENT DOCUMENTS

| | | | |
|---|---|---|---|
| 3,763,478 | 10/1973 | Yoshizawa et al. | 328/223 |
| 4,626,715 | 12/1986 | Ishii | 307/571 |
| 4,728,826 | 3/1988 | Einzinger et al. | 307/571 |
| 4,873,460 | 10/1989 | Ripple | 307/571 |
| 4,897,559 | 1/1990 | Yun-Ho | 307/269 |
| 4,902,914 | 2/1990 | Masouka | 307/571 |
| 4,950,919 | 8/1990 | Rossi et al. | 307/571 |

FOREIGN PATENT DOCUMENTS 3233204 3/1983 Fed. Rep. of Germany .

OTHER PUBLICATIONS

Weijten; "Philips Technical Review"; Dec. 1986.

Primary Examiner—Stanley D. Miller
Assistant Examiner—Terry D. Cunningham
Attorney, Agent, or Firm—Bernard Franzblau

[57] ABSTRACT

A control circuit for a clock electrode of an integrated circuit includes two semiconductor switches (TP, TN) which are controllable from a clock pulse generator (CG) and via which semiconductor switches one of two direct voltages (+Va, oV) is periodically applied to a clock electrode (E), constituting a capacitive load, of an integrated circuit (IC). In order to reduce the energy dissipation, the clock electrode is connected to ground via a series arrangement (LC) of an inductance (L) and a capacitance (C). The clock pulse generator triggers the switches (TP, TN) in a manner such that the switches are successively conductive with an interval thereinbetween in which both switches are non-conductive. As a result, a resonant circuit (L, C, CE) consisting of the inductance (L), the capacitance (C) and the clock electrode capacitance (CE) is active during the in between intervals.

10 Claims, 1 Drawing Sheet

5,107,136

CONTROL CIRCUIT FOR AT LEAST ONE CLOCK ELECTRODE OF AN INTEGRATED CIRCUIT

BACKGROUND OF THE INVENTION

This invention relates to a control circuit for at least one clock electrode, constituting a capacitive load, of an integrated circuit, which control circuit comprises at least two controllable semiconductor switches each having an output coupled to a terminal of the clock electrode, an input coupled to an associated terminal for connection to an associated direct voltage and a control input coupled to an associated terminal for coupling to a clock pulse generator so that the clock electrode is periodically switchable between two direct voltages.

A control circuit of this type for an integrated circuit, more particularly implemented as an image sensor, is known from an article in Philips Technical Review, Vol. 43, no. 1, December 1986, pp. 1 to 8, entitled "The accordion imager, a new solid-state image sensor". The two semiconductor switches are in the form of MOS transistors in which the output is a drain electrode, the input is a source electrode and the control input is a gate electrode. A first MOS transistor is of the p-channel type and a second is of the n-channel type and they are arranged in series between a terminal conveying a higher direct voltage and a terminal conveying a lower direct voltage. The gate electrodes are interconnected and are connected to the drain electrode of a third MOS transistor whose gate electrode is connected to the clock pulse generator. The three transistors jointly constitute an element of a shift register in which the gate electrode of the third transistor is connected to the drain electrodes of the first and second transistors of the previous shift register element. The described shift register implementation to the control circuit is specific of the so-called accordion control of the image sensor.

Apart from the specific implementation of the control circuit described, it appears that the clock electrode is periodically switched between the higher direct voltage and the lower direct voltage. The clock electrode then has a capacitance which is periodically charged and discharged via a series resistor. The series resistor not only comprises the source drain resistor of the conducting transistor but also parasitic series resistors. Recharging of the clock electrode capacitance is thereby accompanied by dissipative losses. These losses are dependent on many factors, particularly on the clock pulse frequency, the number of clock pulse phases, the values of the capacitances provided and the voltage difference between the higher and the lower voltage. The energy dissipation is not only unwanted because of its energy loss, but also because of the heating of the integrated circuit.

SUMMARY OF THE INVENTION

It is an object of the invention, inter alia, to provide a control circuit for a clock electrode of an integrated circuit in which the energy dissipation is reduced. To this end a control circuit according to the invention is characterized in that a terminal of the clock electrode in the control circuit is coupled to a DC terminal via a series arrangement of an inductance and a capacitance, whereby this inductance, together with this capacitance and a clock electrode capacitance constitute a resonant circuit, said clock pulse generator being arranged to supply clock pulses to the control inputs of the semiconductor switches so that the switches are periodically and successively conducting with an interval therebetween in which both switches are non-conducting.

Due to the measure according to the invention, the energy in the clock electrode capacitance is stored temporarily in the inductance of the resonant circuit so that this energy can be used again, which may lead to a considerable reduction of energy consumption.

It is to be noted that an inverter circuit for an inductive load comprising a gas discharge lamp in series with a coil and a bridge capacitor is known per se from DE-A 38.13.672, with a capacitor being arranged parallel to this series arrangement. This capacitor serves to suppress interference upon neighbouring radio receivers. However, the L-C series arrangement according to the present invention serves to reduce the energy dissipation in the integrated circuit.

BRIEF DESCRIPTION OF THE DRAWING

The invention now will be described, by way of example, with reference to the accompanying drawing, in which.

DESCRIPTION OF THE PREFERRED EMBODIMENTS

Figure 1:
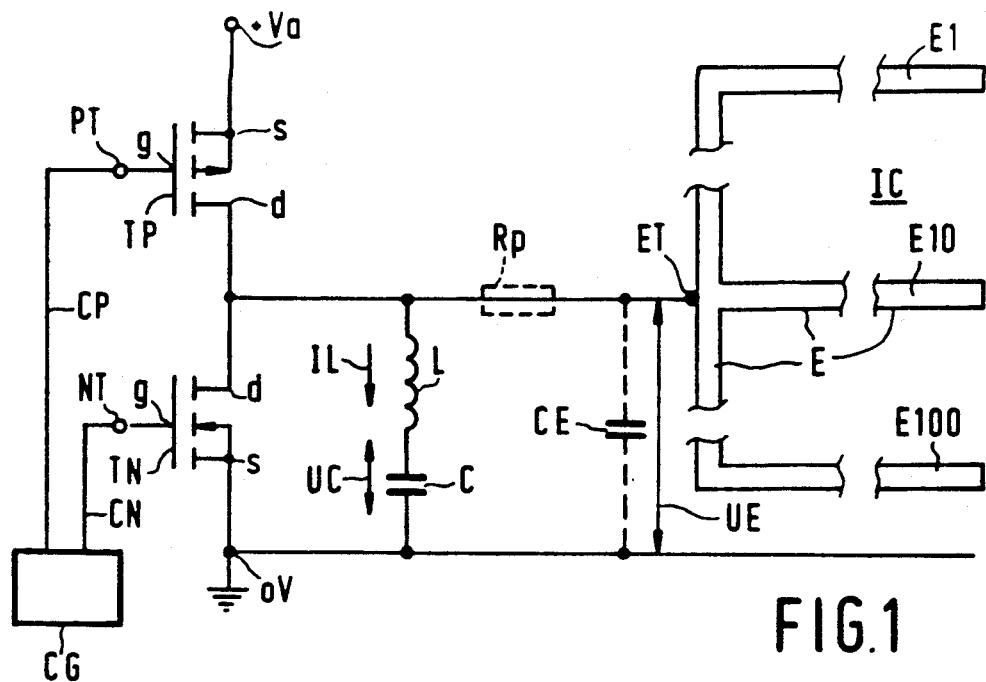
FIG. 1 shows diagrammatically an embodiment of a control circuit according to the invention.
Figure 2:
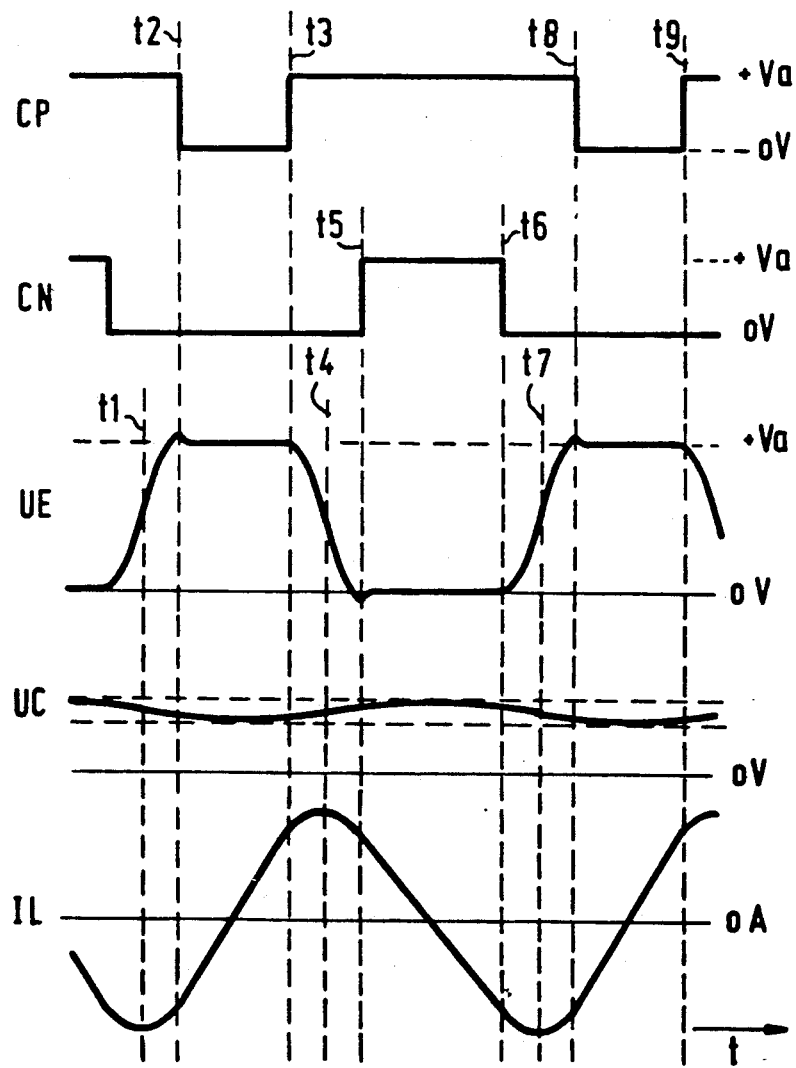
FIG. 2 shows some time diagrams of voltages and a current to explain the operation of the circuit of FIG. 1.

In FIG. 1 the reference IC denotes an integrated circuit, only a clock electrode E of which is shown partly. The integrated circuit IC may be in the form of an image or line sensor, a delay line, a memory, etc., for example, operating as a charge transfer device. The references E1, E10 and E100 denote some clock electrode strips which are present on or in the circuit IC and which may form a part of the electrode E. The electrode E may also be in the form of a single strip. The reference ET denotes a terminal of the electrode E and a clock electrode voltage is denoted by UE between this terminal and a ground connection (oV). With respect to ground conveying the ground potential of oV, the electrode E has a capacitance which is denoted by CE. The clock electrode capacitance CE is assumed to comprise parasitic capacitances. The clock electrode terminal ET is coupled to a junction point of two controllable semiconductor switches TP and TN shown as MOS transistors coupled in series circuit to terminals of a source of direct voltage. The switch to be further described includes transistors TP and TN which are of the p and of the n-channel type, respectively, as has been illustrated by means of an arrow head in a substrate connection of each transistor. Outputs of the transistors TP and TN, shown as drain electrodes d, are coupled to the clock electrode terminal ET. Inputs of the transistors TP and TN, shown as source electrodes s, are coupled to terminals conveying a direct voltage +Va and oV, respectively. Control inputs of the transistors TP and TN, shown as gate electrodes g, are coupled to terminals PT and NT, respectively, of a clock pulse generator CG. The generator CG applies clock pulse signals CP and CN to the terminals PT and NT, respectively. A circuit is known in which the clock pulse signals CP and CN in the control circuit described so far are two clock pulse signals occurring in phase opposition and having the same variation. However, according to an aspect of the invention, the clock pulse signals CP and CN are not in phase opposition, which is illustrated by means of the signal variation shown in FIG. 2. FIG. 2 shows time diagrams as a function of time t with instants t1 to t9. The clock pulse signals CP and CN show a voltage variation between +Va and oV. The voltage of oV is present between the instants t2 and t3, and t8 and t9 in the signal CP and during these periods the transistor TP is turned on between the terminal conveying the voltage +Va and the terminal ET, while due to CN=oV the transistor TN is turned off. The voltage of +Va is present between, inter alia, the instants t5 and t6 in the signal CN, the transistor TN being turned on while due to CP=+Va the transistor TP is turned off. Between the instants t3 and t5, and t6 and t8, with CP=+Va and CN=oV the two transistors TP and TN are turned off. The intervals between t3 and t5 and between t6 and t8 of the clock pulse signals CP and CN are an aspect of the invention.

According to another aspect of the invention, the terminal ET of the clock electrode E is coupled to a DC terminal via a series arrangement (L, C) of an inductance L and a capacitance C. According to FIG. 1, this is the DC terminal conveying the ground potential of oV. The series arrangement (L, C) may alternatively be connected to a terminal conveying a different voltage. The reference IL denotes a current through the inductance L. The reference UC denotes a voltage across the capacitance C. The capacitance C may be present in the form of a capacitor in the control circuit or it may form part of the integrated circuit IC. The reference Rp denotes a parasitic resistance between the junction point of the transistors TP and TN and the inductance L and the clock electrode terminal ET. The resistance Rp is assumed to comprise all series resistors which exert an influence when recharging the clock electrode capacitance CE. The inductance L and the capacitances C and CE jointly constitute a resonant circuit (L, C, CE) in which the parasitic resistance Rp occurs.

FIG. 2 shows the voltage variation of the voltages UE and UC and the current variation of the current IL. The current IL has a more or less cosine-shaped variation between the instants t2 and t8 with respect to a zero current oA. In this case the voltage UC has a small voltage variation. The value of the voltage variation is dependent on the value of the capacitance C with respect to the value of the clock electrode capacitance CE. If the capacitance C has a value which is a factor of the order of five times larger than the value of the capacitance CE, then the resonant frequency of the parallel resonant circuit, L, C and CE is determined mainly by the values of L and CE and the voltage UC can be considered to be substantially constant. The voltage UE has a signal variation at which the voltage +Va and the voltage oV are present via the conducting transistors TP (t2 to t3, and t8 to t9) and TN (t5 to t6), respectively. The resonant circuit (L, C, CE) is active during the intervals between the instants t3 and t5 as well as t6 and t8 in which the transistors TP and TN are both non-conducting. The references t1, t4 and t7 denote the intermediate instants of three intervals at which the current IL is maximum. FIG. 2 shows an overshoot caused by the resonant circuit (L, C, CE) at the instants t2, t5 and t8. The edge steepness of the overshoot is substantially determined by the value of the inductance L.

FIG. 2 shows that the time difference (t3−t2) is smaller than the time difference (t6−t5). Consequently, the time difference (t4−t1) is smaller than the time difference (t7−t4). The quotient of the time difference (t4−t1) and the time difference (t7−t1), the latter time difference being equal to the clock pulse period of the signals CP and CN, determines the duty cycle of the transistors TP and TN.

As compared with the known method of recharging the clock electrode capacitance CE, the use of the resonant circuit (L, C, CE) leads to a saving in energy.

The instants t2 and t5 at which the transistors TP and TN must be turned on under the control of the clock pulse signals CP and CN, respectively, are not critical due to the use of the MOS transistors TP and TN shown. This is due to the presence of a drain substrate diode in the MOS transistors. This diode becomes conducting before the instants t2 and t5 for the transistors TP and TN, respectively. This yields a further saving in energy because the source-drain voltage is decreased at the instant when the transistor is turned on. When using bipolar transistors instead of the MOS transistors TP and TN, a parallel diode may be arranged across the transistor so as to realise a noncritical turn-on.

FIG. 1 shows a single clock electrode terminal ET for connection to the drain electrode d of the respective transistors TP and TN and the series arrangement (L, C). Instead, two or three terminals can be arranged proximate to or remote from each other at the integrated circuit IC.

If desired, parts of the control circuit can be integrated in the integrated circuit. The inductance L may be constituted in known manner by a gyrator circuit and a capacitance. In this case even the entire control circuit can be integrated in the integrated circuit.

I claim:

1. A control circuit for at least one clock electrode, constituting a capacitive load, of an integrated circuit, which control circuit comprises: at least two controllable semiconductor switches each having an output coupled to a terminal of the clock electrode, an input coupled to an associated terminal for connection to a respective first and a second terminal of a source of direct voltage and a control input coupled to a respective terminal for coupling to terminals of a clock pulse generator so that the clock electrode is periodically switchable between the first and second terminals of the direct voltage source, a series arrangement of an inductance and a capacitance connected between the outputs of the controllable semiconductor switches and one of the terminals of the source of direct voltage, wherein said inductance, together with said capacitance and the clock electrode capacitive load capacitance constitute a resonant circuit, said clock pulse generator supplying clock pulses to the control inputs of the semiconductor switches so that the semiconductor switches are periodically and successively alternately conductive with an interval therebetween in which both switches are non-conductive.

2. A control circuit as claimed in claim 1, wherein said capacitance has a value which is a factor of the order of five times larger than the value of the clock electrode capacitance.

3. A control circuit as claimed in claim 1 wherein said series arrangement of the inductance and the capacitance is coupled in parallel with one of said semiconductor switches and the series arrangement together with the capacitive load capacitance comprise the resonant circuit during the non-conductive interval.

4. A control circuit as claimed in claim 3 wherein said clock electrode capacitive load has a capacitance effectively in parallel with said inductance-capacitance series arrangement.

5. A control circuit for a capacitive load comprising:
an output terminal for connection of the capacitive load,
first and second controllable semiconductor switches each having an output electrode and a control electrode,
first and second input terminals for supplying a DC voltage to the control circuit,
means coupling inputs of said first and second semiconductor switches to said input terminals,
a clock pulse generator having output means coupled to the control electrodes of the first and second semiconductor switches to supply first and second out of phase control voltages thereto such that said semiconductor switches are periodically and alternately made to conduct with a time interval between conductive intervals in which both semiconductor switches are simultaneously in cut-off,
a series arrangement of an inductance (L) and a capacitance (C) coupled to said output terminal and to one said input terminal such that the inductance, the capacitance and the capacitive load will together form a resonant circuit, and
means coupling said output electrodes of the semiconductor switches to said output terminal, and wherein
the resonant circuit is active during said time interval in which both semiconductor switches are cut-off.

6. A control circuit as claimed in claim 5 wherein said output electrodes form a common node between the first and second semiconductor switches and wherein said LC series arrangement is connected effectively in parallel with the capacitive load between the common node and said one input terminal.

7. A control circuit as claimed in claim 5 wherein said clock pulse generator supplies to the respective control electrodes of the semiconductor switches first and second control voltages each having an approximately rectangular waveform such that the conductive interval of each semiconductor switch is less than its cut-off interval.

8. A control circuit as claimed in claim 5 wherein said first and second semiconductor switches comprise a P-channel and a N-channel MOS transistor, respectively, and wherein in operation of the control circuit, the LC series arrangement is conductive during the time interval in which both semiconductor switches are cut-off to return energy to a capacitive load connected to the output terminal.

9. A control circuit as claimed in claim 5 wherein said capacitive load comprises at least one clock electrode of an integrated circuit.

10. A control circuit as claimed in claim 9 wherein at least the first and second semiconductor switches, the clock pulse generator and the capacitance are a part of said integrated circuit.

* * * * *